(12) United States Patent
Saffarian

(10) Patent No.: US 6,246,334 B1
(45) Date of Patent: Jun. 12, 2001

(54) BOARD ID DISPLAY SYSTEM

(75) Inventor: Andy Saffarian, Mahwah, NJ (US)

(73) Assignee: Dialogic Corporation, Parsipanny, NJ (US)

( * ) Notice: Subject to any disclaimer, the term of this patent is extended or adjusted under 35 U.S.C. 154(b) by 0 days.

(21) Appl. No.: 09/299,162

(22) Filed: Apr. 26, 1999

(51) Int. Cl.$^7$ .................................................. G08B 5/22
(52) U.S. Cl. ........................... 340/815.45; 340/815.4; 340/815.47; 439/490; 324/764
(58) Field of Search .................. 340/815.45, 815.42, 340/815.47, 815.44, 815.53, 815.49, 815.4, 815.6; 361/679, 748; 439/490, 910; 362/26, 24, 31; 710/10; 324/764, 759; 382/145

(56) References Cited

U.S. PATENT DOCUMENTS

| | | | |
|---|---|---|---|
| 4,434,489 | * 2/1984 | Blyth | 371/29 |
| 4,469,553 | * 9/1984 | Whitehead | 156/627 |
| 5,003,251 | * 3/1991 | Fuoco | 324/158 |
| 5,387,901 | * 2/1995 | Hardt | 340/815.42 |
| 5,450,570 | * 9/1995 | Richek et al. | 395/500 |
| 5,790,041 | * 8/1998 | Lee | 340/815.45 |
| 5,876,239 | * 3/1999 | Morin et al. | 493/490 |
| 5,990,802 | * 11/1999 | Maskeny | 340/815.45 |
| 6,082,620 | * 7/2000 | Bone | 235/462.16 |

* cited by examiner

Primary Examiner—Daniel J. Wu
Assistant Examiner—Anh La
(74) Attorney, Agent, or Firm—Kaplan & Gilman, LLP

(57) ABSTRACT

An improved board ID number display mechanism whereby an LCD or LED or similar display is utilized on the backplane of a circuit card. The display is viewable for outside the computer case, making it possible to ascertain the board's ID number without having to open up the computer case and examine jumper or switch patterns.

23 Claims, 1 Drawing Sheet

BOARD ID DISPLAY SYSTEM

TECHNICAL FIELD

This invention relates to circuit board configurations within computers, and in a preferred embodiment, to an improved technique of configuring and identifying circuit boards for use in a computer telephony system on a variety of computer platforms, including both personal computers (PCs) and servers.

BACKGROUND OF THE INVENTION

PCs and servers often contain one or more slots on the backplane thereof, which may be populated with circuit boards performing a variety of functions. In typical computer telephony systems, a plurality of computer telephony boards may be used to populate the backplane of a PC or server system. A typical computer telephony application includes software which may run on the PC or server and which may communicate with a plurality of different types of computer telephony boards installed on the backplane of the computer. Each board is typically identified by an identification (ID) number which is conveyed to the application software for use in running the application. In instances where there may be boards of different types, each board ID number is associated with a particular board type, and the application then knows each board ID number and its corresponding board type (voice, video, fax, data, etc.).

The problem with such an application is that if it displays, on the computer screen, all of the board ID numbers and their associated board types, there is no way for the operator to determine which plugs on the back of the computer correspond to which boards. Thus, there is also no way for the operator to determine which board ID numbers correspond to which boards without opening the computer case. More specifically, if the application displays to the operator the fact that board ID number 123 is the analog telephone board, the operator will not know what board is associated with ID number 123 unless she opens the case of the computer, examines the switch or jumper arrangement and determines which board has a switch or jumper arrangement that corresponds to the binary coded number for 123. This cumbersome arrangement is unacceptable.

Another problem with such a system is that even after the computer case is opened, it is difficult to ascertain the board ID number. Specifically, the operator has to 1) locate the switches or jumpers inside of the dark, tight quarters of the computer case, and 2) translate the switch arrangement (e.g., the jumper pattern) into a recognizable board ID number. One must be able to ascertain the binary state of each jumper (i.e., 1 or 0) and translate that state into a number.

In view of the foregoing, there exists a need in the art for a more convenient mechanism to recognize the board ID number of a circuit board in a computer telephony system.

SUMMARY OF THE INVENTION

The above and other problems of the prior art are overcome in accordance with the present invention which relates to a technique of allowing an operator to efficiently ascertain the board ID number associated with a particular computer telephony board, so that the proper connections can be made thereto.

A board ID number is assigned via the application software, and the identity of the board is displayed on an LED, LCD or other similar display which is viewable from the portion of the board which is visible outside of the computer case. Accordingly, once the application displays what type of board is associated with a particular board ID number, the operator can ascertain the ID number, and thus, the physical board itself by simply viewing the back case of the computer without opening the same.

As an additional feature, the display may be intercepted and controlled by the computer telephony board's own processor. At that time, the display may then display status information such as faults, percentage of maximum load, or other status information regarding the board. Thus, the display can be used to identify the board ID number as well as for any other desired information which is unique to the particular board.

The board may contain a simplistic switching mechanism that normally displays the board ID number and other board status information but is capable of rerouting any one or more signals from the board or from a computer's central processing unit (CPU) for display on the backplane. At that time, the display may then display CPU status information such as faults, percentage of maximum load under which the processor is operating, processor speed, or other status information regarding the remainder of the computer.

Additionally, the application software running on the PC or server may cause the display to exhibit the board ID number of other boards in the system with other data that may assist in analyzing system or board status. This allows the inventive technique to be utilized with systems that have a mix of boards both with and without display capability.

In addition to querying the boards and ascertaining the board ID numbers, the technique is also used to assign ID numbers to newly installed boards in the system. Specifically, the software running on the CPU interrogates the numerous boards and ascertains all of the assigned numbers. The software then assigns an unused board ID number for use by next newly installed board in the system. If no prior boards are assigned ID numbers, then the system may assign the first available board ID number to the newly installed board. Additionally, the system may have a sequence of board ID numbers, or it may have allow an operator to assign the ID number for use by the newly installed board.

DETAILED DESCRIPTION OF THE PREFERRED EMBODIMENT

Figure 1:
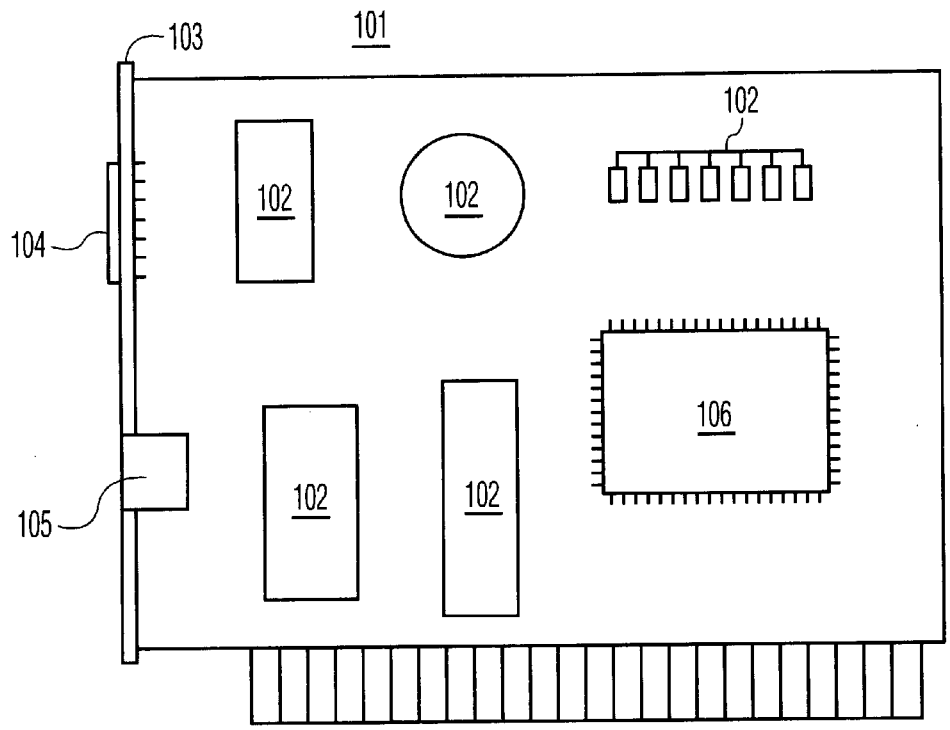
FIG. 1 shows a prospective view of an exemplary computer telephony board for use in a computer telephony system.
Figure 2:
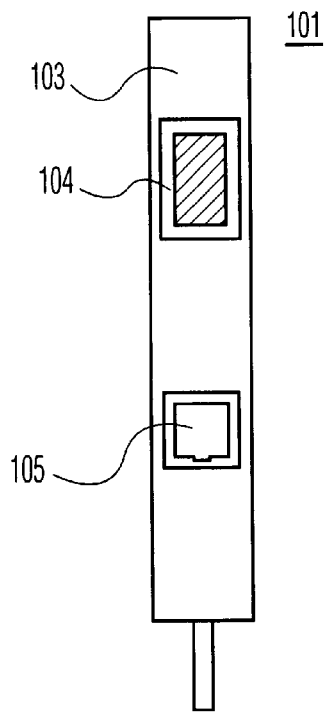
FIG. 2 shows a backplane view of the exemplary computer telephony board of FIG. 1.

FIGS. 1 and 2 shows an exemplary computer telephony board 101 including a plurality of components 102. The processor and components thereof 106 of computer telephony board 101 is included within plurality of components 102. The backplane 103 of the board includes a display 104 and an exemplary RJ11 telephone jack 105. The display 104 is placed such that it is viewable from the outside of the back of the PC or server in which board 101 is installed.

In operation, the software configures the board to a particular board ID number by writing a predetermined bit pattern to that board. The ID number is associated with a particular type of board (e.g., four channel computer telephony board, etc.) and the board ID number and/or other information is displayed on display 104. The operator may then observe the board type from outside of the computer case, without having to dismantle the entire case.

Further, via the software, the operator instructs the board processor component 106 to interrupt the board ID information and change display 104 to displaying any of a variety of board processor information, including processor faults and percentage of maximum load under which the processor is operating.

Similarly, via the software, the operator instructs the computer CPU to interrupt the board ID information and change display 104 to displaying any of a variety of CPU information, including processor faults, percentage of maximum load under which the processor is operating, and processor speed.

The software also configures computer telephony boards that are installed on the PC or server, other than board 101, to other board ID numbers. These board ID numbers and/or other information concerning these various boards are displayed on display 104 of board 101. The software also assigns ID numbers to newly installed boards in the system by interrogating all the boards on the system and ascertaining their assigned ID numbers. The software then assigns, in sequence, the next unused board ID number for use by the next newly installed board. Alternately, the software will prompt the operator to assign the ID to the newly installed board.

While the above describes the preferred embodiment of the invention, various modifications or additions will be apparent to those of skill in the art. Such modifications are intended to be covered by the following claims.

What is claimed is:

1. A board identification (ID) number display mechanism, comprising:
   a means for determining a switch arrangement for a circuit board;
   a means for determining a board ID number which corresponds with said switch arrangement and
   a display means for displaying said board ID number that corresponds with said switch arrangement, wherein said display means is mounted on said circuit board at a location such that, when said circuit board is installed in a computer, said board ID number is viewable from outside of said computer.

2. The board ID number display mechanism of claim 1 wherein said display means is mounted on a backplane of said circuit board.

3. The board ID number display mechanism of claim 1 wherein said switch arrangement is one or more jumpers.

4. The board ID number display mechanism of claim 1 wherein said display means is a digital display.

5. The board ID number display mechanism of claim 4 wherein said digital display is an LED display.

6. The board ID number display mechanism of claim 4 wherein said digital display is an LCD display.

7. The board ID number display mechanism of claim 4 wherein said board ID number is displayed in binary format.

8. The board ID number display mechanism of claim 4 wherein said board ID number is displayed in decimal format.

9. The board ID number display mechanism of claim 1 wherein said display means is interruptible by a circuit board processor such that said means displays status information from said circuit board processor regarding said board.

10. The board ID number display mechanism of claim 9 wherein said status information is percentage of maximum load.

11. The board ID number display mechanism of claim 9 wherein said status information is faults.

12. The board ID number display mechanism of claim 1 wherein said display means is further capable of displaying information associated with another board installed inside said computer.

13. The board ID number display mechanism of claim 2 wherein said information comprises a board ID number of said another board.

14. A method of identifying a board for an operator of a multi-board computer-based system, said board being installed inside a computer, the method comprising the steps of:
   electronically determining a switch arrangement for a circuit board;
   determining a board ID number which corresponds with said switch arrangement; and
   displaying said board ID number on a displaying means mounted on said board such that said board ID number is viewable from outside of said computer.

15. The method of claim 14 wherein the computer is a personal computer (PC).

16. The method of claim 14 wherein the computer is a server.

17. The method of claim 14 further comprising a step of displaying, on said display means, a board ID number of another board installed inside said computer.

18. The method of claim 14 further comprising a step of displaying status information regarding said board from a circuit board processor.

19. A method of assigning board ID numbers to each of a plurality of circuit boards in a computer telephony system, said method comprising executing software on a CPU of a computer, said software operable to interrogate a plurality of said circuit boards and ascertain board ID number assigned to each of said circuit boards, assigning to a circuit board without a board ID number an available unassigned board ID number, and displaying each of said assigned board ID number on a display means mounted on said each board associated to said board ID number such that it is viewable from outside of said computer.

20. The method of claim 19 wherein the computer is a PC.

21. The method of claim 19 wherein the computer is a server.

22. The method of claim 19 wherein said software on said CPU also permits an operator to alter the board ID number associated with a board after said ID number is assigned.

23. The method of claim 19 wherein after said step of assignment, board ID numbers associated with each of the boards are displayed to an operator on a screen of the computer.

\* \* \* \* \*